(12) United States Patent
Oman et al.

(10) Patent No.: US 7,385,828 B2
(45) Date of Patent: Jun. 10, 2008

(54) ELECTRONIC SHUNT RESISTOR ASSEMBLY

(75) Inventors: Todd P. Oman, Greentown, IN (US); John V Caputo, Canfield, OH (US)

(73) Assignee: Delphi Technologies, Inc., Troy, MI (US)

( * ) Notice: Subject to any disclaimer, the term of this patent is extended or adjusted under 35 U.S.C. 154(b) by 125 days.

(21) Appl. No.: 11/341,356

(22) Filed: Jan. 27, 2006

(65) Prior Publication Data
US 2007/0177318 A1    Aug. 2, 2007

(51) Int. Cl.
*H05K 1/18* (2006.01)
(52) U.S. Cl. .......................................... 361/763; 361/58
(58) Field of Classification Search ................ 361/763, 361/58; 174/522
See application file for complete search history.

(56) References Cited

U.S. PATENT DOCUMENTS

| | | |
|---|---|---|
| 4,572,878 A | 2/1986 | Daugherty |
| 5,877,563 A | 3/1999 | Krappel et al. |
| 6,218,805 B1 | 4/2001 | Melcher |
| 6,787,935 B2 | 9/2004 | Heim |
| 2001/0009499 A1* | 7/2001 | Carlson ...................... 361/683 |
| 2002/0051906 A1 | 5/2002 | Wakata et al. |
| 2004/0012396 A1* | 1/2004 | Batson ........................ 324/444 |
| 2004/0055371 A1 | 3/2004 | Sanchez et al. |
| 2005/0176282 A1 | 8/2005 | Hirthammer |
| 2006/0227495 A1* | 10/2006 | Stockman .................... 361/328 |

OTHER PUBLICATIONS

Dipl. Ing. A. Heim (BMW Group); Intelligent Battery Sensor: Key component of active energy flow control in motor vehicles over the whole product line; Munchen; pp. 1-13.

* cited by examiner

*Primary Examiner*—Tuan T. Dinh
*Assistant Examiner*—Yuriy Semenenko
(74) *Attorney, Agent, or Firm*—David P. Wood

(57) ABSTRACT

An electronic shunt resistor assembly comprises a planar shunt resistor and an electronic monitoring unit. The planar shunt resistor has a resistance element and first and second terminal bars at opposite ends of the resistance element. The electronic measuring unit has a circuit board that is supported on the planar shunt resistor and that includes input contacts for electronic components carried by the circuit board arranged along one edge of the circuit board and input/output contacts for the electronic components arranged along a opposite edge of the circuit board. A first plurality of electrical connectors connect the first terminal bar to the input contacts and a second plurality of electrical connectors connect the second terminal bar to the output contacts of the circuit board. The electrical connectors are attached to the terminal bars and the contacts solderlessly.

17 Claims, 4 Drawing Sheets

ELECTRONIC SHUNT RESISTOR ASSEMBLY

FIELD OF THE INVENTION

This invention generally relates to an electronic shunt resistor assembly and a method to electrically connect a shunt resistor to a substrate supporting electronic components.

BACKGROUND OF THE INVENTION

The low resistance value of a shunt resistor results in very small voltage measurements as low as 3 µV. To minimize the measurement error from parasitic voltages developed by dissimilar metals and temperature gradients, the conductor materials used in connection with a shunt resistor shall be the same metallic elements. The parasitic voltages can also be minimized by eliminating the temperature differences between the various parts of the circuit as these temperatures can contribute to measurement error in the application.

Current solutions accomplish the connection between the shunt resistor and the substrate supporting the electronic components by soldering as shown in U.S. Pat. No. 6,787,935 granted to Andreus Heim Sep. 7, 2004, or by using scythe-type lines bent upward by 90 degrees of the transmission connections. Alternatively, the connection between the shunt resistor and the substrate can be accomplished by soldering S-shaped copper interconnects as shown in the prior art assembly of FIG. 1 which is described in more detail below. This latter connection method provides stress relief to allow for mismatch between the expansion rates of the substrate and the shunt material.

The weakness of these connection methods is that the soldered interfaces induce voltage measurement error. Moreover the connection methods are difficult to process because significant energy is required to heat the large copper slug sufficiently to reflow solder. The voltages induced by the various metals involved in the connection are increased by the thermal differences between the metals. Since the voltages that are to be measured across the shunt resistor are very small (as low as 3 µV), the induced voltages can significantly affect the accuracy of the shunt voltage measurement.

SUMMARY OF THE INVENTION

This invention provides an electronic shunt resistor assembly that minimizes the thermal differences and the material differences in the connection junctions between the shunt resistor and the electronic monitoring circuit to eliminate errors in the shunt voltage measurement. The invention is disclosed in four embodiments that accomplish these objectives.

DETAILED DESCRIPTION OF PREFERRED EMBODIMENTS

Figure 1:
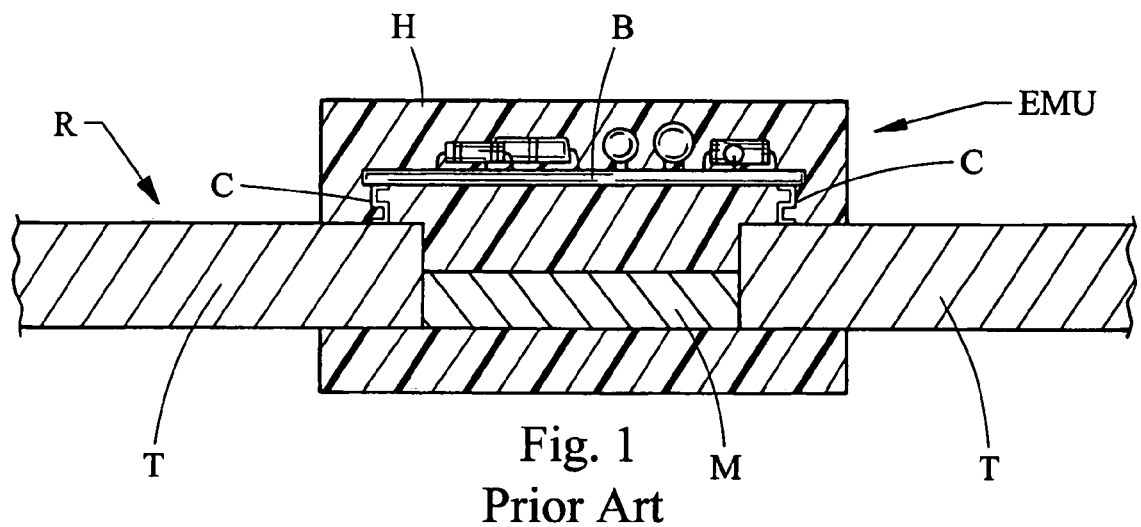
FIG. 1 is a longitudinal section of a prior art electronic shunt resistor assembly.

As background, FIG. 1 discloses a prior art electronic shunt resistor assembly comprising a planar monitoring shunt resistor R and an electronic measurement unit EMU. The planar shunt resistor R has a manganin resistance element M for its mid section and copper terminal bars T at each end. The electronic monitoring unit EMU has a circuit board B that carries a number of electronic components and contacts for the electronics arranged along opposite edges of the circuit board. The contacts are connected to the copper terminal bars by S-shaped copper connectors C that are soldered at one end to one of the contacts of the terminal board and at the opposite end to one of the terminal bars T. The circuit board B and the ends of the terminal bars T are over-molded with a plastic housing H.

Figure 2:
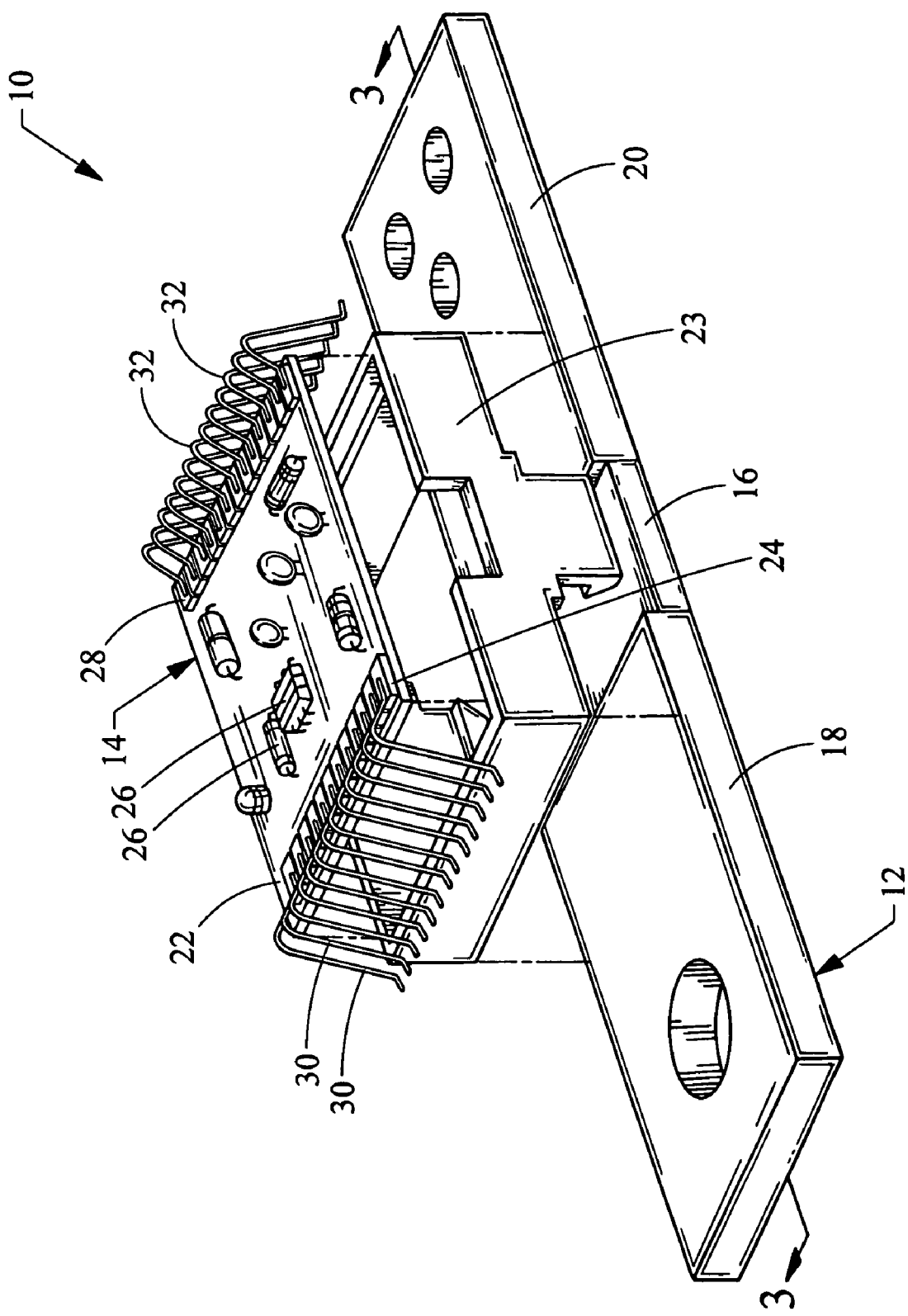
FIG. 2 is an exploded, perspective view of an electronic shunt resistor assembly of the invention.
Figure 3:
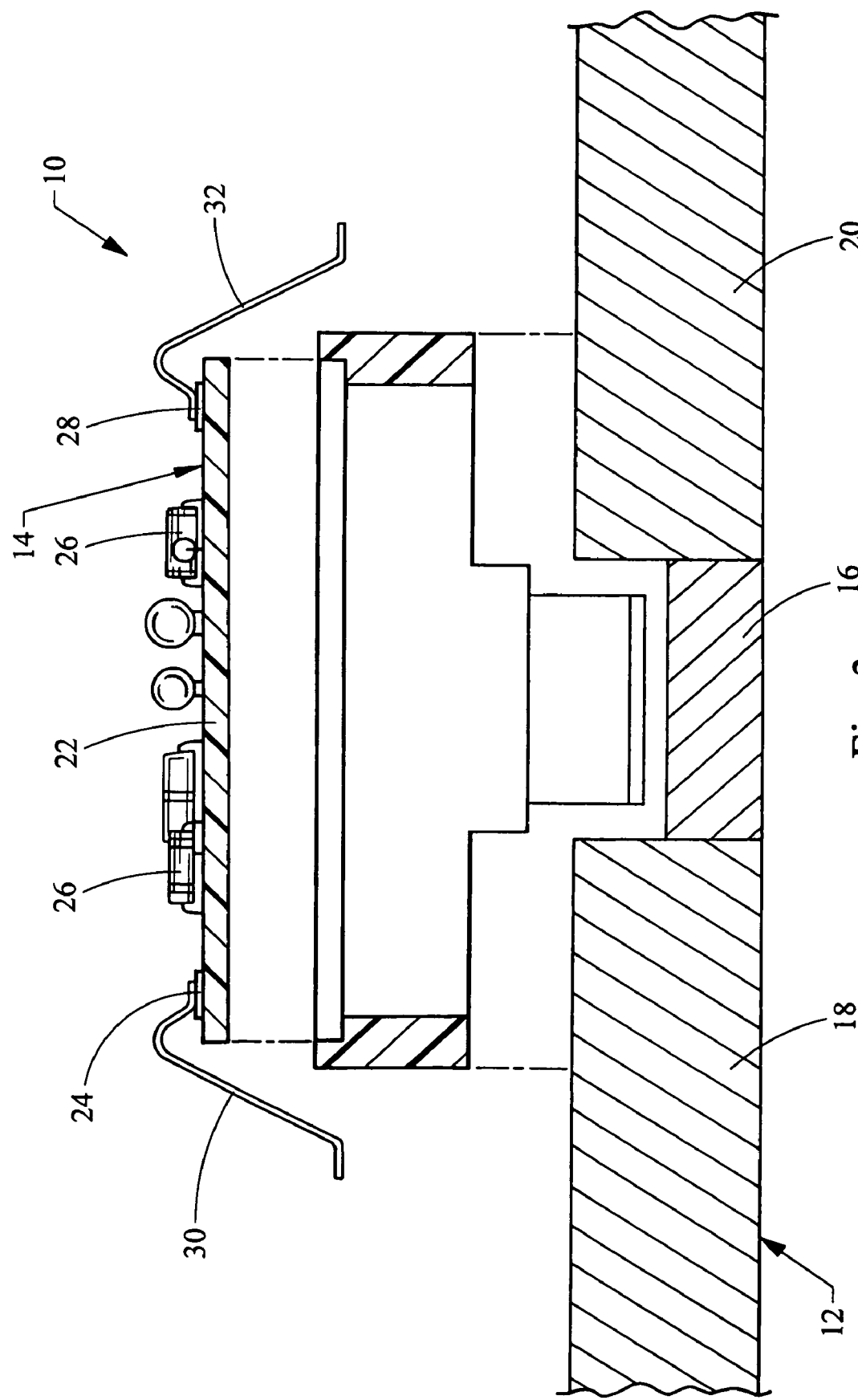
FIG. 3 is a longitudinal section of the electronic shunt resistor assembly of FIG. 2.

Referring now to the first embodiment of the invention disclosed in connection with FIGS. 2 and 3, the electronic shunt resistor assembly 10 comprises a planar shunt resistor 12 and an electronic monitoring unit 14. The planar shunt resistor 12 has a resistance element 16 for its mid section and terminal bars 18 and 20 at the respective ends of the resistance element. Resistance element 16 may be of a material selected from the group consisting of manganin, zeranin and isaohm while the terminal bars 18 and 20 are preferably of a material that has substantially the same thermal coefficient of expansion as the material of the resistance element, such as copper or a copper alloy when manganin, zeranin or isaohm is used for the resistance element.

The electronic monitoring unit 14 has a circuit board 22 that is supported on the planar shunt resistor 12 by a plastic frame 23. Circuit board 22 is preferably of a material that has substantially the same coefficient of thermal expansion as the resistance element 16 and the terminal bars 18 and 20. In the example cited above, the material for the circuit board would be a conventional board material such as FR4 which is mixture of materials with epoxy resin as the main constituent. The circuit board may also be comprised of an inorganic substrate such as ceramic.

Circuit board 22 includes input contacts 24 for electronic components 26 carried by circuit board 22 in order to monitor desired characteristics, such as the voltage drop across the resistor 16. Input contacts 24 are preferably arranged along one edge of circuit board 22. Circuit board 22 also has input/output contacts 28 for the electronic components 26 with input/output contacts 28 preferably being arranged along a opposite edge of circuit board 22. In the example cited above, contacts 24 and 28 are preferably copper or a copper alloy that has substantially the same coefficient of thermal expansion and electrical properties as the resistance element 16 and the terminal bars 18 and 20.

Electronic shunt resistor assembly 10 further includes a first plurality of electrical connectors 30 connecting the terminal bar 18 at one end of the resistance element 16 to the input contacts 24 of circuit board 22 and a second plurality of electrical connectors 32 connecting the terminal bar 20 at an opposite end of the resistance element 16 to the input/output contacts 28 of circuit board 22. The electrical connectors 30 and 32 are wires that are also of material that has substantially the same electrical properties and coefficient of thermal expansion as the other components discussed above. In the example that is discussed above, the material of the electrical connectors 30 and 32, i.e. the wires 30 and 32 is selected from the group consisting of copper and copper alloys. The electrical connectors 30 and 32 are not only of a selected material but the electrical wires 30 and 32 are also bonded to the respective terminal bars 18 and 20 and to the respective contacts 24 and 28 solderlessly to avoid or at least reduce parasitic voltage drops that can be produced by the use of dissimilar materials and/or differential thermal expansion of the components. The solderless bond or wire-bonding is preferably achieved by ultrasonic welding which is a well known conventional process.

Thus in this first embodiment, copper or copper alloy wire bonds are used to connect the shunt resistor 12 to the monitoring circuit of the electronic monitoring unit 14. The shunt attachment points are copper or copper alloy as are the attachment points on the monitoring circuit board 22. The same metals are used in each junction thereby eliminating problems associated with the use of dissimilar metals. Moreover, the wire bonds can be repeated to create a redundant connection with effective heat transfer capability which minimizes the thermal gradients between the different electronic components of the monitoring circuit. The attachment process is preferably a ultra-ultrasonic weld which is well known in the integrated circuit packaging industry.

Figure 4:
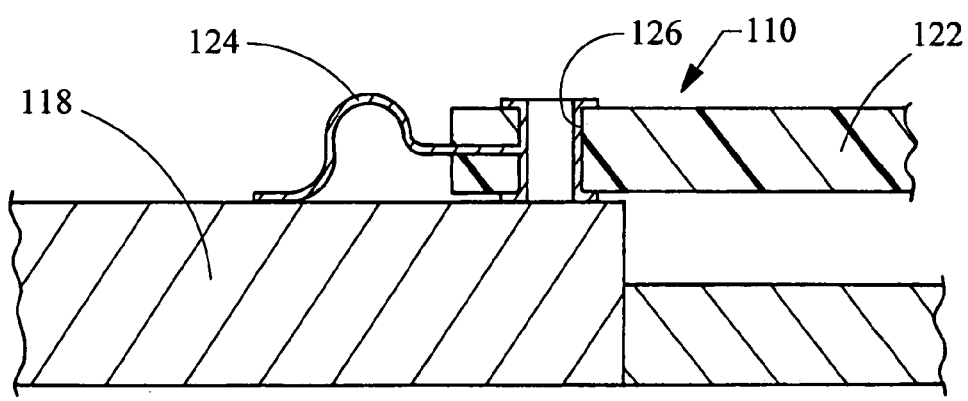
FIG. 4 is a partial longitudinal section of another electronic shunt resistor assembly of the invention.

Referring now to the second embodiment of the invention disclosed in connection with FIG. 4, the electronic shunt resistor assembly 110 that is the same as the electronic shunt resistor assembly 10 except that the electrical connectors 124 are copper or copper alloy foil leaves that are copper plated to the contact vias 126 of the circuit board 122 and bonded to the terminal bar 118 or 120 (not shown) at the opposite end. The foil leaves which are shaped like gull wings are bonded to the terminal bars by welding techniques such as spot welds, friction stir welds, resistance welds, arc welds or ultrasonic welds.

Thus in this second embodiment, copper foil leaves are bonded to the circuit board using a commonly used via hole and copper plating process. The leaves will then be welded to the copper terminal bars. The advantages of the second embodiment like the first, are that the same metals are used at each junction thereby eliminating problems associated with the use of dissimilar metals. Moreover, the copper leaves are effective heat transfer paths which minimize the thermal gradients at the junctions.

Figure 5:
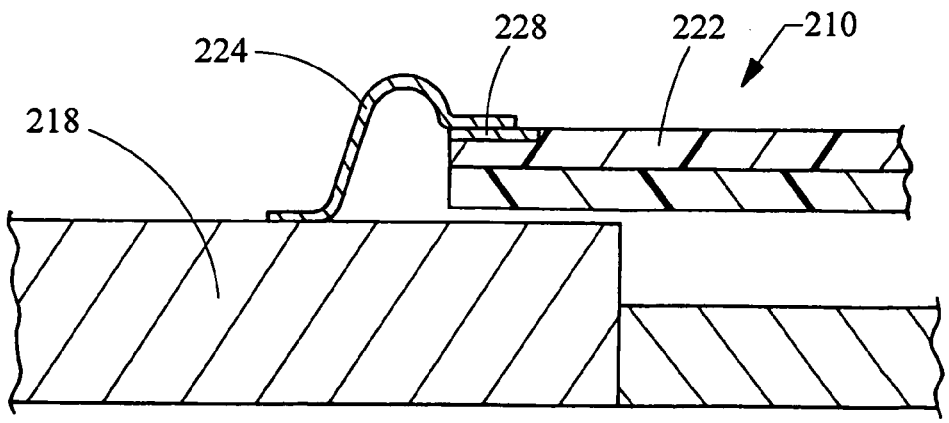
FIG. 5 is a partial longitudinal section of still another electronic shunt resistor assembly of the invention.

Referring now to the third embodiment of the invention disclosed in connection with FIG. 5, the electronic shunt resistor assembly 210 is the same as the electronic shunt resistor assembly 110 with the exception that the circuit board 222 has an inorganic substrate rather than an organic substrate. In this case, the circuit board may include contacts 228 for the electronic components as in the case of the first embodiment. Here the copper leaves 224 are bonded to the contacts 228 at one end and to the terminal bars such as terminal bar 218 at the opposite end. As before, the gull wing-shaped leaves are bonded to the contacts as well as the terminal bars by welding techniques such as spot welds, resistance welds, arc welds or ultrasonic welds. Alternatively, the electronic shunt resistor assembly 210 may have copper leaves 224 that are integral extensions of electrical traces of the circuit board 222 (not shown) thus eliminating the need for contacts 228 and the need bonding the copper leaves 224 to contacts 228. Integral copper leaves 224 are provided by removing portions of the circuit board 222 from beneath portions of the traces that are used for the copper leaves 224.

Figure 6:
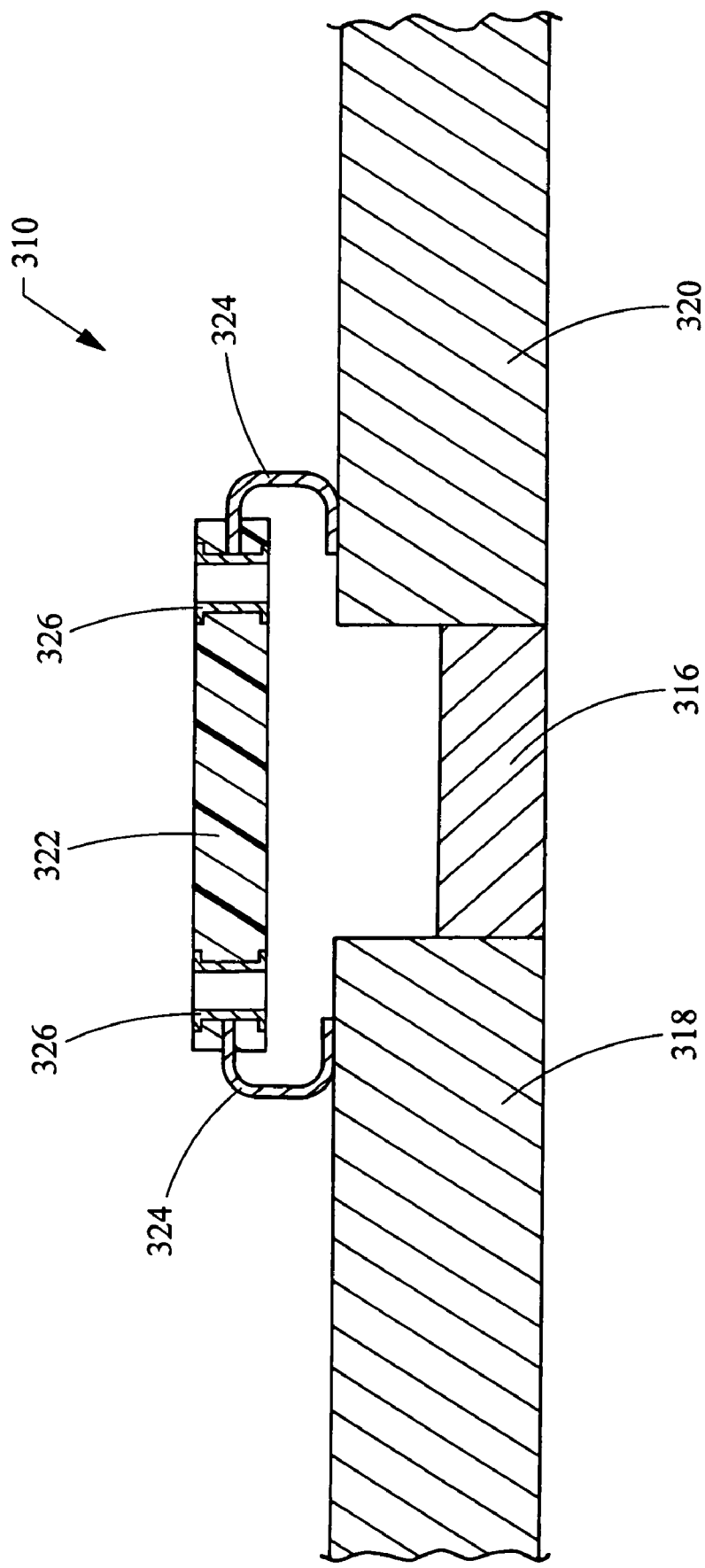
FIG. 6 is a partial longitudinal section of still yet another electronic shunt resistor assembly of the invention.

Referring now to the fourth embodiment of the invention disclosed in connection with FIG. 6, the electronic shunt resistor assembly 310 that is the same as the electronic shunt resistor assembly 110 except that the foil leaves 324 are C-shaped instead of being shaped like gull wings. The C-shaped foil leaves 324 are preferably copper or copper alloy foil leaves that are copper plated to contact vias 326 of circuit board 322. Consequently the C-shaped foil leaves 324 can be used in conjunction with inorganic substrates such as shown in FIG. 5 as well as with the organic substrate circuit board 322 that is shown in FIG. 6.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiments, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. An electronic shunt resistor assembly comprising:

a planar shunt resistor and an electronic unit monitoring;

the planar shunt resistor having a resistance element and first and second terminal bars at opposite ends of the resistance element, the electronic measuring unit having a circuit board that is supported on the terminal bars of the planar shunt resistor and that includes contacts for electronic components carried by the circuit board arranged along each of two opposite edges of the circuit board, and a first plurality of electrical connectors connecting the first terminal bar to the contacts along one of the two opposite edges of the circuit board and a second plurality of electrical connectors connecting the second terminal bar to the contacts along another of the two opposite edges of the circuit board wherein the electrical connectors are attached to the terminal bars and the contacts solderlessly.

2. The electronic shunt resistor assembly of claim 1 wherein the first and second plurality of electrical connectors are wires that are bonded to the terminal bars of the planar resistor shunt and the contacts of the circuit board.

3. The electronic shunt resistor assembly of claim 1 wherein the first and second plurality of electrical connectors are foil leaves that are bonded to the terminal bars and the contacts of the circuit board.

4. The electronic shunt resistor assembly of claim 3 wherein the first and second plurality of electrical connectors are bonded to the terminal bars by spot welds, resistance welds or ultrasonic welds.

5. The electronic shunt resistor assembly of claim 4 wherein the foil leaves are shaped like gull wings.

6. The electronic shunt resistor assembly of claim 4 wherein the foil leaves are C-shaped.

7. The electronic shunt resistor assembly of claim 1 wherein the wherein the first and second plurality of electrical connectors are foil leaves that are integral extensions of electrical traces or vias of the circuit board and that are bonded to the terminal bars.

8. The electronic shunt resistor assembly of claim 1 wherein the circuit board is supported on the terminal bars by a preformed plastic frame.

9. The electronic shunt resistor assembly of claim 8 wherein the preformed plastic frame has lock arms that engage the resistance element to attach the preformed plastic frame to the planar shunt resistor.

10. The electronic shunt resistor assembly of claim 8 wherein the preformed plastic frame has lock arms that engage the resistance element to attach the preformed plastic frame to the planar shunt resistor.

11. An electronic shunt resistor assembly comprising:
   a planar monitoring shunt resistor and an electronic measurement unit;
   the planar shunt resistor having a resistance element for its mid section and terminal bars at each end,
   the resistance element be of a material selected from the group consisting of manganin, zeranin and isaohm,
   the terminal bar being of a material selected from the group consisting of copper and copper alloys,
   the electronic monitoring unit having a circuit board that is supported on the terminal bars of the planar shunt resistor and that includes input contacts for electronic components carried by the circuit board, the input contacts being arranged along one edge of the circuit board,
   the circuit board being of a resinous or ceramic material and having input/output contacts for the electronic components arranged along a opposite edge of the circuit board,
   the contacts being of a material selected from the group consisting of copper and copper alloys,
   a first plurality of electrical connectors connecting the terminal bar at one end of the resistance element to the input contacts of the circuit board, and
   a second plurality of electrical connectors connecting the terminal bar at an opposite end of the resistance element to the input/output contacts of the circuit board wherein the electrical connectors are a material selected from the group consisting of copper and copper alloys and are bonded to the terminal bars and the contacts solderlessly.

12. The electronic shunt resistor assembly of claim 11 wherein the first and second plurality of electrical connectors are wires that are bonded to the terminal bars of the shunt resistance and the contacts of the circuit board.

13. The electronic shunt resistor assembly of claim 11 wherein the first and second plurality of electrical connectors are foil leaves that are bonded to the terminal bars of the shunt resistance and the contacts of the circuit board.

14. The electronic shunt resistor assembly of claim 13 wherein the first and second plurality of electrical connectors are bonded to the resistance connections by spot welds, friction stir welds, resistance welds or ultrasonic welds.

15. The electronic shunt resistor assembly of claim 14 wherein the foil leaves are shaped like gull wings.

16. The electronic shunt resistor assembly of claim 14 wherein the foil leaves are C-shaped.

17. The electronic shunt resistor assembly of claim 11 wherein the circuit board is supported on the terminal bars by a preformed plastic frame.

* * * * *